US011794187B2

(12) United States Patent
Issadore et al.

(10) Patent No.: US 11,794,187 B2
(45) Date of Patent: Oct. 24, 2023

(54) HIGHLY PARALLELIZED DROPLET MICROFLUIDIC APPARATUS

(71) Applicant: The Trustees Of The University of Pennsylvania, Philadelphia, PA (US)

(72) Inventors: David Issadore, Philadelphia, PA (US); Melaku Muluneh Woldemariam, Philadelphia, PA (US)

(73) Assignee: The Trustees of the University of Pennsylvania, Philadelphia, PA (US)

(*) Notice: Subject to any disclaimer, the term of this patent is extended or adjusted under 35 U.S.C. 154(b) by 272 days.

(21) Appl. No.: 16/359,368

(22) Filed: Mar. 20, 2019

(65) Prior Publication Data

US 2019/0275523 A1 Sep. 12, 2019

Related U.S. Application Data

(63) Continuation of application No. 14/900,759, filed as application No. PCT/US2014/058579 on Oct. 1, 2014, now abandoned.

(60) Provisional application No. 61/886,378, filed on Oct. 3, 2013.

(51) Int. Cl.

| | |
|---|---|
| ***B81C 1/00*** | (2006.01) |
| ***B81C 99/00*** | (2010.01) |
| ***B01L 3/00*** | (2006.01) |
| ***B01F 23/41*** | (2022.01) |
| ***B01F 33/81*** | (2022.01) |
| ***B01F 33/3011*** | (2022.01) |
| ***B01F 35/10*** | (2022.01) |

(52) U.S. Cl.

CPC ........ *B01L 3/502784* (2013.01); *B01F 23/41* (2022.01); *B01F 33/3011* (2022.01); *B01F 33/813* (2022.01); *B01F 35/10* (2022.01); *B01L 3/502707* (2013.01); *B01L 2200/027* (2013.01); *B01L 2200/0673* (2013.01); *B01L 2200/12* (2013.01); *B01L 2300/0887* (2013.01); *B01L 2300/0893* (2013.01)

(58) Field of Classification Search

None

See application file for complete search history.

(56) References Cited

U.S. PATENT DOCUMENTS

| | | | |
|---|---|---|---|
| 2006/0285999 | A1 | 12/2006 | Timperman |
| 2011/0053151 | A1 | 3/2011 | Hansen et al. |
| 2012/0121481 | A1 | 5/2012 | Romanowsky et al. |

FOREIGN PATENT DOCUMENTS

| | | | |
|---|---|---|---|
| WO | 2012/164086 | A1 | 12/2012 |

OTHER PUBLICATIONS

International Preliminary Report On Patentability for International Application No. PCT/US2014/058579, dated Apr. 14, 2016, 7 pages.

(Continued)

*Primary Examiner* — Paul S Hyun

(74) *Attorney, Agent, or Firm* — BakerHostetler

(57) ABSTRACT

A microfluidic device contains a first layer having a plurality of channels, a second layer having a plurality of droplet makers, and a third layer having a plurality of through-holes connecting the plurality of channels to the plurality of droplet makers. The channels have a height of at least 4 times greater than the height of the droplet makers. The microfluidic device has at least 500 droplet makers in an area less than 10 cm$^2$. The channels are formed by direct laser-micromachining and the droplet makers are formed by soft lithography molding.

20 Claims, 11 Drawing Sheets

(56) References Cited

OTHER PUBLICATIONS

International Search Report and Written Opinion for PCT/US2014/058579 dated Dec. 30, 2014, 7 pages.
Nisisako et al., "Microfluidic large-scale integration on a chip for mass production of monodisperse droplets and particles", Lab on a Chip, Feb. 2008, 8, 287-293.
Romanosky et al., "High throughput production of single core double emulsions in a parallelized microfluidic device", Lab on a Chip, 2012, 12, 802-807.
Supplementary European Search Report for Application No. EP 14 85 1296, dated May 8, 2017, 8 pages.
Anonymous, "Microfluidics/Hydraulic resistance and capacity—Wikibooks, open books for an open world," , Jun. 4, 2008. pp. 1-4.

HIGHLY PARALLELIZED DROPLET MICROFLUIDIC APPARATUS

CROSS REFERENCE TO RELATED APPLICATIONS

This application is a continuation of U.S. application Ser. No. 14/900,759, "Highly Parallelized Droplet Microfluidic Apparatus" (filed Dec. 22, 2015), which is a U.S. national phase application of PCT/US2014/058579, "Highly Parallelized Droplet Microfluidic Apparatus" (filed Oct. 1, 2014), which claims priority to U.S. Provisional Application No. 61/886,378, "Highly Parallelized Droplet Microfluidic Apparatus" (filed Oct. 3, 2013), the contents of which foregoing applications are incorporated by reference herein in their entireties for any and all purposes.

TECHNICAL FIELD

The present invention relates to highly parallelized droplet microfluidic apparatuses and methods for making such apparatuses.

BACKGROUND

Microfluidics have been used to generate a wide variety of micro-scale emulsions and vesicles, with control over size, shape, and composition not possible with conventional methods. These microfluidic devices utilize a flow geometry known as a droplet maker or drop maker.

The droplet maker takes advantage of the fluid dynamics through the microfluidic channels to generate individual droplets surrounded by a continuous medium. The simplest droplet maker geometry consists of a T-junction, in which one channel is orthogonal to a second channel. A first fluid flows through one channel and shears off droplets of a second fluid in the second channel. By controlling the flow rates of the two fluids, the droplet size can be accurately controlled.

The production of micrometer-scale emulsions have been utilized for a wide variety of applications including digital biological assays, the generation of functional microparticles, and the on-chip synthesis of nanoparticles. The small feature-size of microfluidics has been harnessed to exert fine control over droplet size, shape, and composition with high levels of uniformity. However, by virtue of its small feature sizes, droplet microfluidic have been limited to low volumetric throughputs $\Phi<1$ mL/hr), making single microfluidic droplet makers unsuitable for high-throughput commercial applications.

However, for conventional single-layer microfluidics the number of inputs/outputs n onto and off of the chip scales with n«N, the number of droplet makers, resulting in an impractically large number of tubes to the outside world. By using a second layer of microfluidic channels to supply each droplet maker, akin to the architecture of an integrated circuit in electronics, large arrays can be packed onto a single chip with only n=3 inputs and outputs. Additionally, devices have been demonstrated that utilize multiple layers of microfabricated channels coupled together with either macroscopically drilled or punched holes.

Attempts have been made to integrate a plurality of droplet makers into a single device, Romanowsky et al. (Lab Chip, 2012, 12, 802-807) discloses a device comprising 15 droplet makers and occupying a volume of 25 cm3. The device of Romanowsky et al. comprises a poly(dimethyl siloxane) (PDMS) device fabricated using soft-lithography techniques. The device is fabricated from two halves joined by a layer containing inlet and outlet holes connecting each droplet maker. The inlet and outlet holes are made using a biopsy punch, which creates holes on a millimeter size scale. The reliance on macroscopic through-holes limits these approaches from being used to create very large numbers of droplet makers (N>>100).

Another approach for integrating a large number of droplet makers has been disclosed by Nisisako et al. (Lab Chip, 2008, 8, 287-293). Nisisako et al. disclose a circular microfluidic device contained within a holder that also serves as a distributors of the fluids. The device of Nisisako et al. comprised a synthetic silica glass substrate etched using a deep reactive ion etching (DRIE) technique. The device comprises 128 droplet makers arranged in a circular geometry with the outlet disposed in the center of the circle. The device measured 6 cm×6 cm×4 cm (144 cm3).

The integration of a large number of these droplet makers onto a single chip for scaled-up commercial applications has remained a challenge. Commercial applications require the production of large volumes.

Thus, there is a desire to further minimize the size of the droplet making device and further maximizing the output. There is also a desire to develop new fabrication techniques for maximizing the density of droplet makers in microfluidic devices.

SUMMARY

The present invention relates to a microfluidic device comprising a plurality of droplet makers.

One aspect of the present invention relates to a microfluidic device comprising a first layer, a second layer, and a third layer. The first layer comprises at least one flow channel for a continuous phase, at least one flow channel for a disperse phase, and at least one outlet channel. The second layer comprises a plurality of droplet makers. The third layer comprises through-holes connecting the channels of the first layer with the plurality of droplet makers on the second layer. The plurality of droplet makers are in fluidic communication with the at least one flow channel for the continuous phase, the at least one flow channel for the disperse phase, and the at least one outlet channel. The channels on the first layer have a height at least 4 times greater than a height of the droplet maker.

Another aspect of the present invention relates to a method of fabricating a microfluidic device comprising forming a plurality of channels in a first layer, wherein the plurality of channels comprises at least one continuous phase channel, at least one disperse phase channel, and at least one outlet channel. The method further comprises forming a plurality of droplet makers in a second layer. Each of the plurality of channels has a height at least 4 times greater than the height of each of the droplet makers. The method also comprises bonding the first layer and the second layer to a third layer, wherein the third layer comprises a plurality of through-holes fluidically connecting the plurality of channels in the first layer to the plurality of droplet makers in the second layer.

DETAILED DESCRIPTION OF ILLUSTRATIVE EMBODIMENTS

Figure 1:
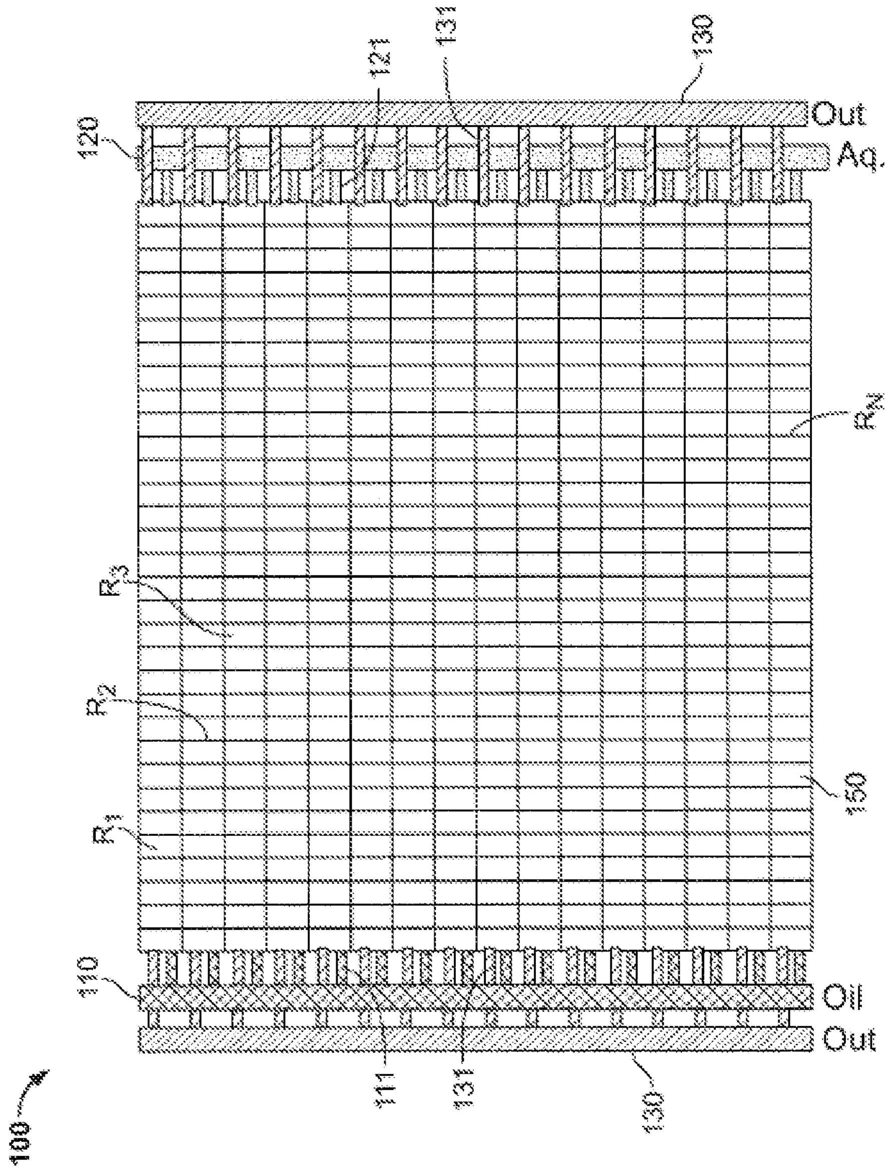
FIG. 1 is a schematic representation of a microfluidic device containing 512 droplet makers.

One aspect of the present disclosure relates to a method for fabricating a microfluidic device comprising a plurality of droplet makers.

According to at least one embodiment, a microfluidic device comprises at least a first layer, a second layer, and a third layer.

The first layer comprises a plurality of supply channels and at least one outlet channel. According to at least one embodiment, the first layer comprises at least one flow channel for a continuous phase, at least one flow. channel for a disperse phase, and at least one outlet channel. In at least one embodiment, the first layer comprises a single channel for the continuous phase and a single channel for the disperse phase.

As used herein, the phrases "continuous phase" and "disperse phase" are used generically to describe the fluid the droplets are contained in and the fluid comprising the droplets, respectively.

Embodiments in accordance with the present disclosure may comprise additional channels for additional fluids, such as when multiple emulsions are produced or when Janus particles are formed. Janus particles comprise at least two distinct phases. In embodiments comprising additional fluids, the fluids comprising the droplets are referred to collectively as the disperse phase, even though one fluid may be dispersed within another fluid, such as when multiple emulsions are formed (e.g., oil-in-water-in-oil emulsions or water-in-oil-in-water emulsions.

The first layer may comprise a single outlet channel, two outlet channels, or more than two outlet channels. The number of outlet channels may be selected based on the number of droplet makers contained within the device, the number of different types of droplets produced by the device, or physical limitations of the device.

The second layer comprises a plurality of droplet makers. The droplet makers may be formed in series or in parallel, such as, for example, in a ladder configuration. In a ladder configuration, the droplet makers are connected in parallel and are fed by the continuous phase channel and the disperse phase channels and the droplets exit through the outlet channel.

The droplet makers may comprise any known droplet maker geometry. For example, the droplet makers may be chosen from T-junction droplet makers, flow focusing droplet makers, Janus particle droplet makers, multiple emulsion droplet makers, and combinations thereof. In at least one embodiment, the droplet makers may all be the same type of droplet makers, or the layer may comprise at least two different types of droplet makers.

In at least one embodiment, the microfluidic device may comprise a two-dimensional array of droplet makers, which may be organized, for example, in rows and columns. According to at least one embodiment, all of the rows or columns may comprise droplet makers having the same inlet and outlet configuration. In other embodiments, the droplets may vary for each row or each column, or over each row or column, such as, for example, by increasing the number of fluid inlets. For example, a portion of the droplet makers in an array of droplet makers may include an additional fluid inlet to create a multiple emulsion. The second layer may also comprise underpasses for connecting channels to arterial lines.

The third layer comprises through-holes connecting the channels of the first layer with the plurality of droplet makers on the second layer.

The plurality of droplet makers are in fluidic communication with the at least one flow channel for the continuous phase, the at least one flow channel for the disperse phase, and the at least one outlet channel.

According to at least one embodiment, the microfluidic device may comprise additional layers. For example, the microfluidic device may comprise an additional layer of droplet makers, which may be serviced by the same channels as the first layer of channels or channels on another layer. In at least one embodiment, the microfluidic device comprises a plurality of layers of droplet makers.

To ensure that each droplet maker behaves identically to the other droplet makers, the microfluidic device has a geometry such that the pressure drop along the supply channel P, remains small compared to the pressure drop across the individual droplet makers Pr<Pd– In at least one embodiment, the microfluidic device is designed such that Equation 1 is satisfied.

$$2N(R_r/R_d)<0.5 \quad \text{(Equation 1)}$$

where $R_r$ is the fluidic resistance along the delivery channel between each droplet maker, Rd is the fluidic resistance of the individual droplet maker, and N is the number of droplet makers in the row. In at least one embodiment, the microfluidic device is designed such that the ratio $2N(R_r/R_d)$ is less than 0.2, such as less than 0.1, less than 0.05, less than 0.01, or less than 0.005. In at least one embodiment, the ratio $2N(R_r/R_d)$ has a value ranging from about 0.001 to about 0.5.

In at least one embodiment, the row delivery lines and droplet makers comprise of rectangular microchannels, whose fluidic resistance R can be approximated by Equation 2.

$$R=12\ \mu l/wh^3 \qquad \text{(Equation 2)}$$

where μ is the dynamic viscosity of the fluid and w, h, and I are the width, height, and length of the microchannel, respectively.

In one example, the row delivery channel has a width $w_r$=0.6 mm, height $h_r$=0.55, and length $l_r$=40 mm. The flow-focusing droplet maker is modeled as rectangular channels in series with $w_d$=50 μm, 30 μm, 50 μm, and $l_d$=1600 μm, 380 μm, 500 pm, $h_d$=3 μm for oil, water, and their mixture respectively. For this exemplary geometry, the design condition Eq. 1 can be satisfied for Nd<360. For the two dimensional array shown schematically in FIG. 1, the number of droplet makers per row $N_d$=32.

In at least one embodiment, the channels have a height at least 4 times greater than the height of the droplet makers. For example, the channels may have a height ranging from 4 to 100 times greater than the height of the droplet makers, such as, for example, from 4 to 50 times greater, from 5 to 25 times greater, or from 10 to 20 times greater.

In at least one embodiment, the channels may have a height of at least 200 μm, such as, at least 250 μm, at least 300 μm, at least 400 μm, at least 500 μm, or greater. For example, the channels may have a height ranging from about 200 pμm to about 1000 μm, such as from about 250 μm to about 500 μm or from about 300 μm to about 400 μm. In accordance with at least one embodiment, the droplet makers may have a height of 40 μm or less, 30 μm or less, 25 μm or less, 20 μm or less, or lower. In at least one embodiment, the droplet makers have a height ranging from about 1 μm to about 40 μm, such as from about 5 μpm to about 30 μm, or from about 10 μm to about 20 μm.

According to at least one embodiment, the channels on the first layer have a height of at least 200 μm and the droplet makers have a height of 50 μm or less.

In at least one embodiment, the microfluidic device may comprise at least 500 droplet makers, such as, for example, at least 1000 droplet makers, at least 10,000 droplet makers, at least 100,000 droplet makers, at least 1,000,000 droplet makers or more. In at least one embodiment, the microfluidic device comprises 500 to 5,000,000 droplet makers, such as, for example, from 1,000 to 2,000,000 droplet makers, or from 10,000 to 1,000,000 droplet makers.

According to at least one embodiment, the droplet makers may cover an area ranging from about 1 $cm^2$ to about 25 $cm^2$. In accordance with at least one embodiment, the droplet makers may cover an area less than about 20 $cm^2$, less than about 15 $cm^2$, less than about 10 $cm^2$, less than about 8 $cm^2$, less than about 5 $cm^2$, or smaller.

In at least one embodiment, the microfluidic device may comprise layers comprised of poly(dimethyl siloxane) (PDMS), glass, silicon, plastic, ceramic, metal, or combinations thereof. In at least one embodiment, the microfluidic device may comprise layers comprised of PDMS, glass, silicon, plastic, or combinations thereof. In at least one embodiment, the microfluidic device may comprise layers comprised of PDMS.

In accordance with at least one embodiment, a self-contained poly(dimethyl siloxane) (PDMS) microchip is fabricated using a combination' of techniques. In at least one embodiment, at least two different techniques are used to fabricate features on the device (e.g., channels or droplet makers) having a different size scale. For example, the channels may be fabricated at a size scale of around 100 to 1000 μm and the droplet makers may be fabricated at a size scale of around 1 to 10 μm. Using at least two different fabrication techniques may allow for increased accuracy or efficiency of production at the different size scales.

Figure 10:
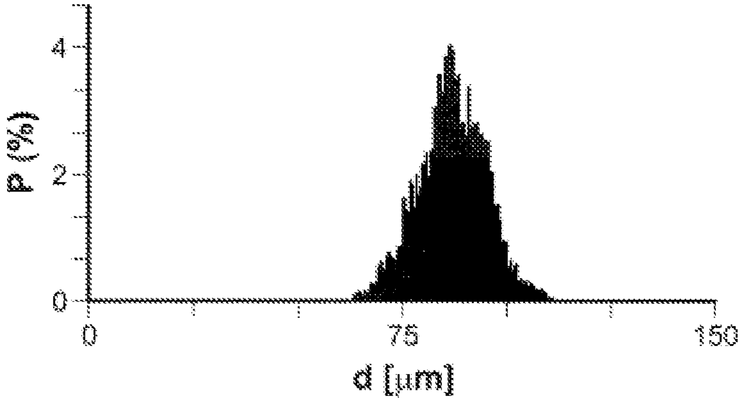
FIG. 10 is a histogram of the diameter of the droplets from a microfluidic device comprising 512 droplet makers.

In at least one embodiment, both soft-lithographic molding and direct laser-micromachining are used to fabricate the droplet makers and channels, respectively. For example, using this approach, a 3×3 $cm^2$ chip was fabricated with a two-dimensional array of 32×16 (512) droplet makers that has only two inputs and one output outside of the chip. On this chip, the microscale resolution of soft lithography was used to fabricate flow-focusing droplet makers that can produce small and precisely defined droplets. Direct laser micromachining was used to fabricate flow channels that supply each droplet maker with its continuous phase and disperse phase (e.g., oil phase and aqueous phase), and access to an output channel. The deeply engraved channels (h~400 pm) have low hydrodynamic resistances, such that each droplet maker can be driven at the same flow rates for highly uniform operation. The engraved channels are in a separate layer from the molded layer, and connections are made with laser-micromachined through-holes. To demonstrate the utility of this platform, uniform r~40 pm water droplets were generated in hexadecane using both an 8×1 and a 32×16 droplet maker geometry (See FIGS. 10 and 15).

In at least one embodiment, a hybrid microchip if fabricated by combining both soft-lithography and laser micromachined structures to integrate large arrays of droplet makers onto a self-contained PDMS microchip.

An exemplary microfluidic chip was built and characterized comprising 512 flow-focusing droplet makers in a 3×3 $cm^2$ two-dimensional array with only two inputs and one output. A schematic representation of the microfluidic chip 100 is shown in FIG. 1. Microfluidic chip 100 comprises 32 rows ($R_1$, $R_2$, $R_3$, . . . $R_N$, where N=32) of droplet makers 150. The droplet makers are supplied with the continuous phase through channels 111, which are fed by arterial line 110, and with the disperse phase through channels 121, which are fed by arterial line 120. Two outlet arterial lines 130 are connected to outlet channels 131.

Figure 2A:
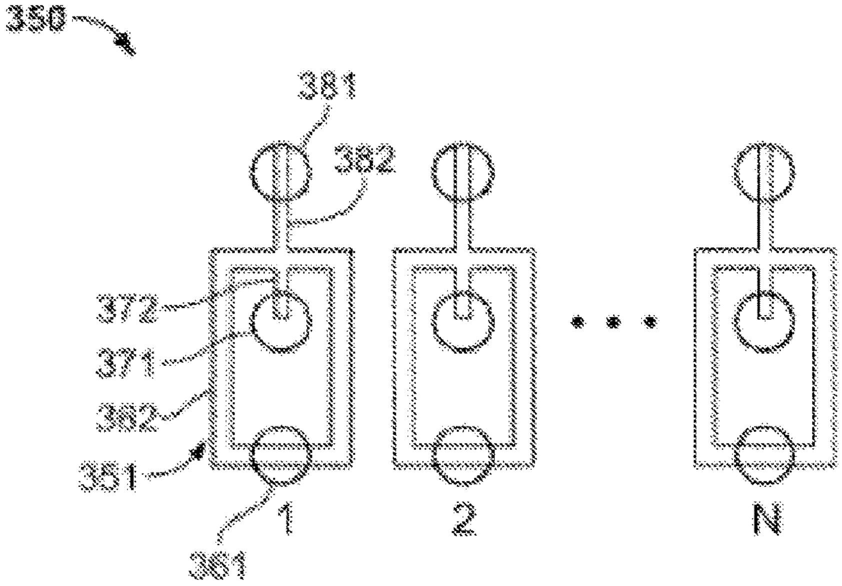
FIG. 2A is a schematic representation of a series of droplet makers.
Figure 2B:
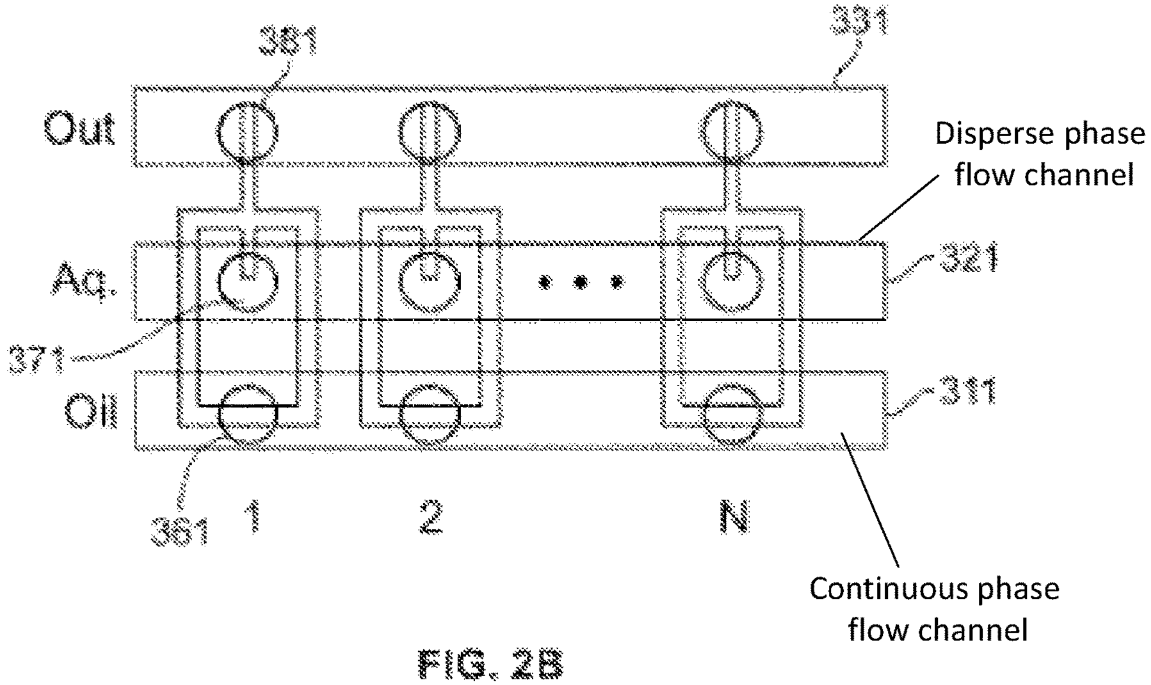
FIG. 2B is a schematic representation of a series of droplet makers connected to channels.
Figure 2C:
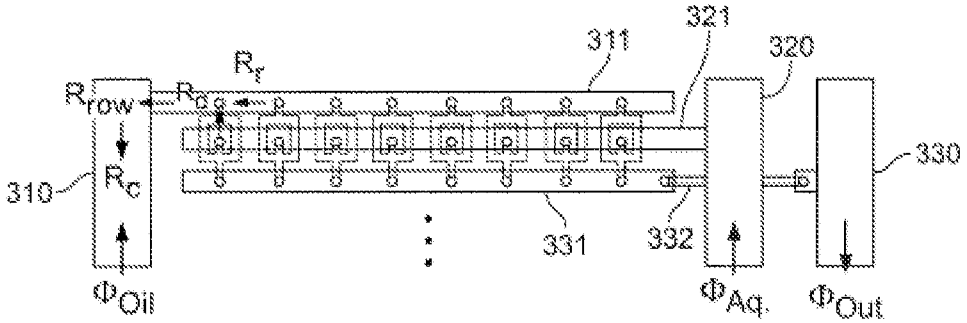
FIG. 2C is a schematic representation of a microfluidic device comprising a row of droplet makers connected in a ladder geometry.

FIG. 2A depicts the individual droplet makers 350. Droplet maker 350 is a flow focusing droplet maker that comprises a microchannel 351, which comprises a circular microchannel 362 for the continuous phase, a short linear microchannel 372 for the disperse phase, and an outlet microchannel 382. The circular microchannel 362 is connected to the continuous phase channel 311 (FIG. 2B) through a through-hole 361. The microchannel 372 is connected to the disperse phase channel 321 through a through-hole 371, and the outlet microchannel 382 is connected to the outlet channel 330 through a through-hole 381. As shown in FIG. 2C, continuous phase channel 311 is connected to a continuous phase arterial line 310, disperse phase channel 321 is connected to a disperse phase arterial line, and outlet channel 331 is connected to an outlet arterial line 330.

In at least one embodiment, the droplet makers are molded using soft-lithography, with micrometer-scale resolution for precise droplet formation. The integrated supply and output lines are laser-micromachined into PDMS for deep channels h~400 μm) with low hydrodynamic resistance to uniformly supply the droplet makers in the molded PDMS layer below. The supply line for each row is organized into a ladder geometry, with each rung of the ladder supplying a single droplet maker. Using a hierarchical design structure, each row in the two-dimensional array is supplied by a main-arterial line. To demonstrate the feasibility of this platform, h~80 pm water droplets were generated in hexadecane containing Span 80 (1.5% v/v) on both a single row 8×1 and a two dimensional array 32×16 (512) droplet maker geometry, with throughput as high as $4\times10^6$ droplets/min.

In at least one embodiment, a laser engraved channel delivers fluid to each row of soft-lithography defined droplet makers, using a ladder geometry.

Figure 3A:
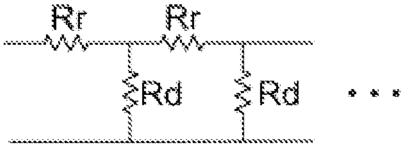
FIG. 3A is a model of the flow resistance for a series of droplet makers in a ladder geometry.
Figure 3B:
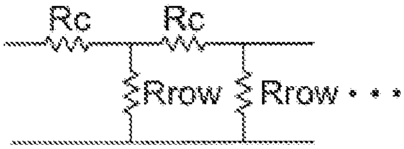
FIG. 3B is a model of the flow resistance for arterial lines having a plurality of rows of droplet makers.

According to at least one embodiment, to deliver fluid to each of the rows, a ladder geometry is used with each row connected to a single arterial supply line (FIG. 2C). In one example, the supply line is a rectangular channel with $w_d$=1.4 mm, $h_d$=0.55 mm, and $l_d$=40 mm. The flow resistance of the droplet makers $R_d$ and flow resistance of the rows $R_r$ is modeled as a series of flow resistors, as shown in FIG. 3A. Because the resistance of the droplet makers are much larger than that of the row delivery lines, the resistance through each row to ground as 32 droplet makers in parallel is modeled as $R_{row}$~$R_d/N_d$ (FIG. 3B). In this example, it is calculated that the design condition Eq. 1 can be satisfied for N<19 (for both the water and oil channels). In the examples that follow, the number of rows per device $N_r$ was set to 16.

Figure 4A:
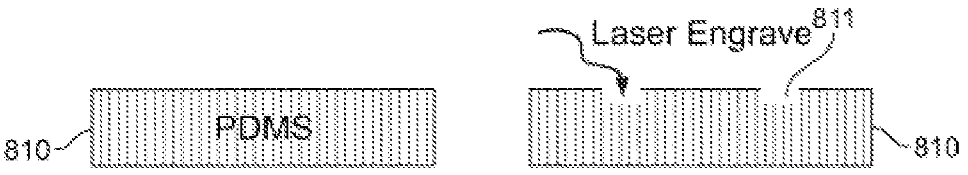
FIG. 4A is a schematic representation of the formation of channels in a layer of a microfluidic device.
Figure 4B:
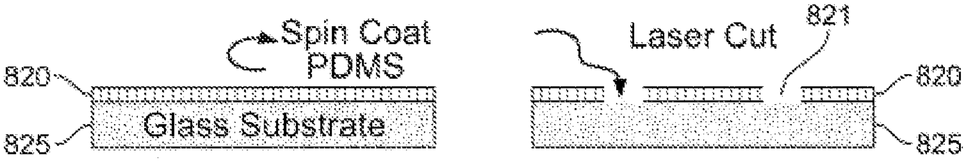
FIG. 4B is a is a schematic representation of the formation of through-holes in a layer of a microfluidic device.
Figure 4C:
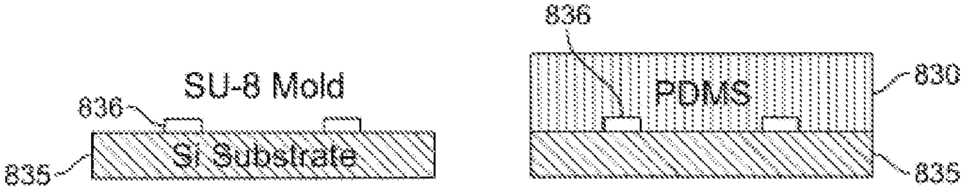
FIG. 4C is a schematic representation of the formation of droplet makers in a layer of a microfluidic device.
Figure 4D:
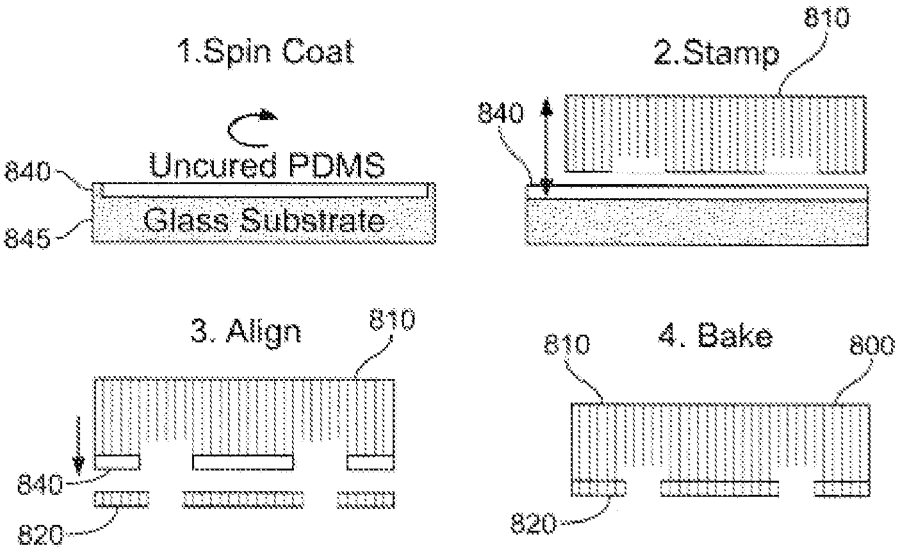
FIG. 4D is a schematic representation of the formation bonding of a layer containing through-holes to a layer containing channels for a microfluidic device.
Figure 5:
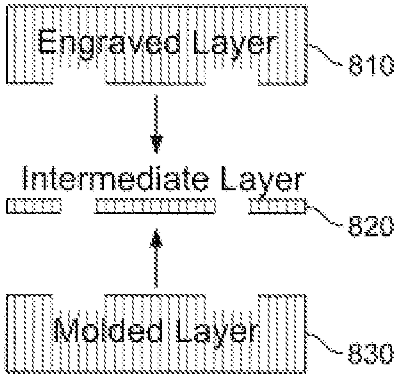
FIG. 5 is a schematic representation showing the three layers of a microfluidic device.

An exemplary fabrication method is shown in FIGS. 4A-4D. The fabrication strategy consists of integrating three separate pieces. 1. A laser-engraved layer of PDMS 810 that contains channels 811 to deliver fluid to the droplet makers below (FIG. 4A). 2. An intermediate layer of spin-coated PDMS 820 on a glass substrate 825 that is laser cut with through-holes 821 to connect the engraved layer to the droplet makers (FIG. 4B). 3. A soft-lithography molded layer of PDMS 830 formed on a silicon substrate 835 containing features 836 that contains a two dimensional array of droplet makers (FIG. 4C). The three separate pieces are bonded together by stamping the pieces into a thin layer of spin-coated uncured PDMS, aligning the pieces together under a stereoscope with a custom alignment rig, and baking (FIG. 4D and FIG. 5). All pieces in this example were fabricated using PDMS.

The laser engraved layer 810 and the intermediate layer 820 were machined using an infrared laser micromachining system (VLS3, VersaLaser). For the engraved layer 810, a 4 mm thick layer of PDMS was poured into a plastic petri dish and baked. This piece was then laser engraved using raster-based laser patterning, for a channel thickness h~400 μm. For the intermediate layer 820, a 200 μm thick layer of PDMS was spin coated (ws-650 mz-23 npp, Laurell). This spin coated layer of PDMS 820 was then laser cut using vector-based laser patterning to cut out the holes 821. Both the engraved 810 and the intermediate layer 820 were cleaned in a solution of Tergazyme detergent (sigma-Aldrich) in DI water for 10 minutes in a sonicator, followed by a 20 minute soak in DI, followed by Nitrogen blow drying. The PDMS was washed using a detergent instead of isopropanol to prevent swelling of the PDMS. Prior to use, the microfluidic channels were coated with Aquapel (PPG industries) to ensure that the are preferentially wet by the hexadecane oil.

EXAMPLES

Single Row Device.

Figure 6:
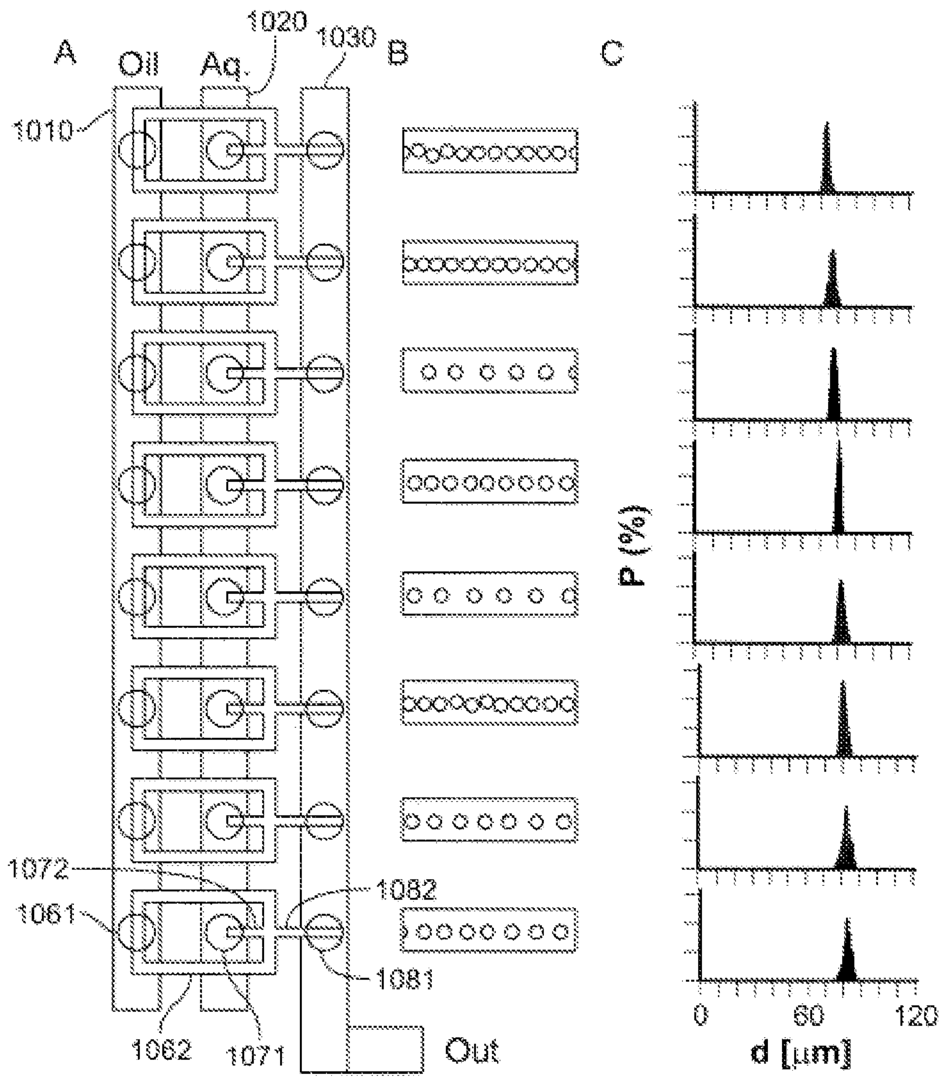
FIG. 6 shows a schematic representation of a series of 8 droplet makers in a ladder geometry, a micrograph of droplets formed by the droplet makers of a microfluidic device containing 8 droplet makers, and the size distribution of the droplets in each of the droplet makers.
Figure 7:
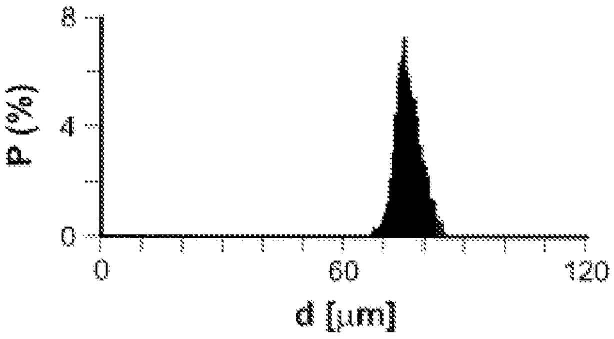
FIG. 7 is a histogram of the diameter of the total output of droplets from the microfluidic device shown schematically in FIG. 6.

A microfluidic device consisting of a single row of 8 droplet makers was made (FIG. 6 and FIG. 7). This device was built with channels 1010, 1020, 1030 extending from each droplet maker, such that droplets could be consistently imaged and droplet size and uniformity characterized. Each droplet maker comprised a microchannel 1062 connected to continuous phase channel 1010 via through-hole 1061, a microchannel 1072 connected to disperse phase channel 1020 via through-hole 1071, and a microchannel 1082 connected to the outlet channel 1030 via through-hole 1081. The aqueous phase input was set to Φ=0.8 ml/hr and the oil phase was set to Φ=3 ml/hr, using two syringe pumps (NE 500, New Era Pumping Systems). Droplet formation was observed on all eight droplet makers using an upright microscope (Nikon, SMZ-1B) (FIG. 6). The rate of droplet formation for the array was $4\times10^5$ droplets/minute. The flow rates were chosen to facilitate characterization by producing spatially separated droplets from each droplet maker. Much higher rates of flow are possible if, for example, peristaltic pumps are used in place of the syringe pumps.

The droplet size and uniformity were analyzed using image analysis software (ImageJ). The average diameter for the droplet makers was d=78.6 um and the coefficient of variation CV of the individual droplet makers was 2.1% (FIG. 6). The CV from the total output of all eight droplet makers was 3.6% (FIG. 12). The variations in drop size did not increase or decrease with position along the ladder geometry, demonstrating that the pressure drop on the supply line was not significant. It was hypothesized that the variations in drop size between droplet makers arose from imperfections in the fabrication of the delivery channels and small misalignments of the layers. These errors could be decreased with further optimization of the fabrication conditions.

Two Dimensional Droplet Array.

Figure 8:
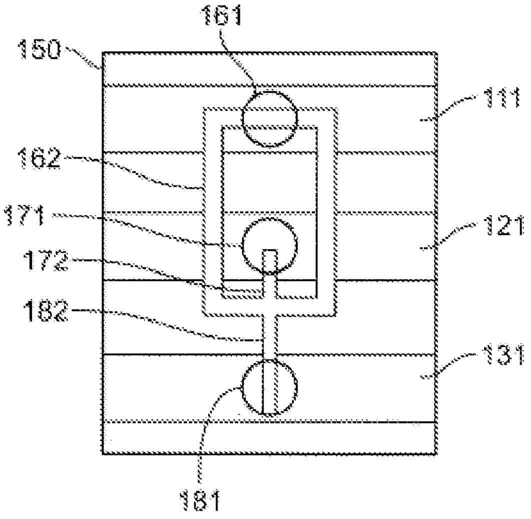
FIG. 8 is a schematic representation of a single droplet maker.

A microfluidic device was fabricated comprising a two dimensional droplet array consisting of 32 rows with each row consisting of 16 droplet makers (FIG. 1). Each of the 512 elements is a flow focusing droplet maker with a 30 pm aperture (FIG. 8). Each droplet maker 150 comprised a microchannel 162 connected to the continuous phase channel 111 via through-hole 161, a microchannel 172 connected to the disperse phase channel 121 via through-hole 171, and a microchannel 182 connected to the outlet channel 131 via through-hole 181. These delivery lines ran across each row in a ladder geometry.

Figure 9:
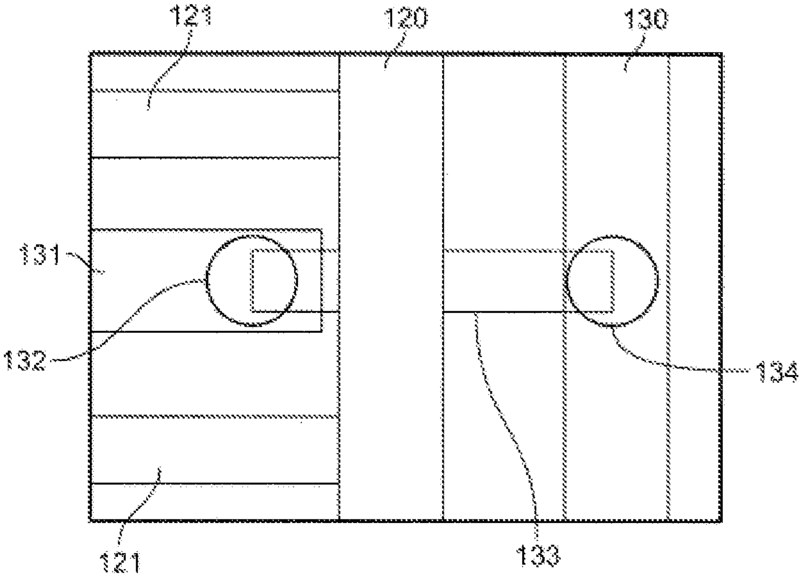
FIG. 9 is a schematic representation of an underpass connecting a channel and an arterial line.

To create a two dimensional array, each row was supplied by an arterial channel 110, 120 in a ladder geometry (FIG. 1). An underpass geometry is utilized to connect each of the rows to the arterial output line (FIG. 9). The underpass 133 brings the fluid from the channel 131 on the engraved level down to the molded level, where is passes under the oil or aqueous supply line 110, 120, and back to the engraved level to meet with the arterial output line 130. The underpass 133 is connected to the outlet channel 131 via through-hole 132 and the arterial outlet 130 via through-hole 134.

Figure 11A:
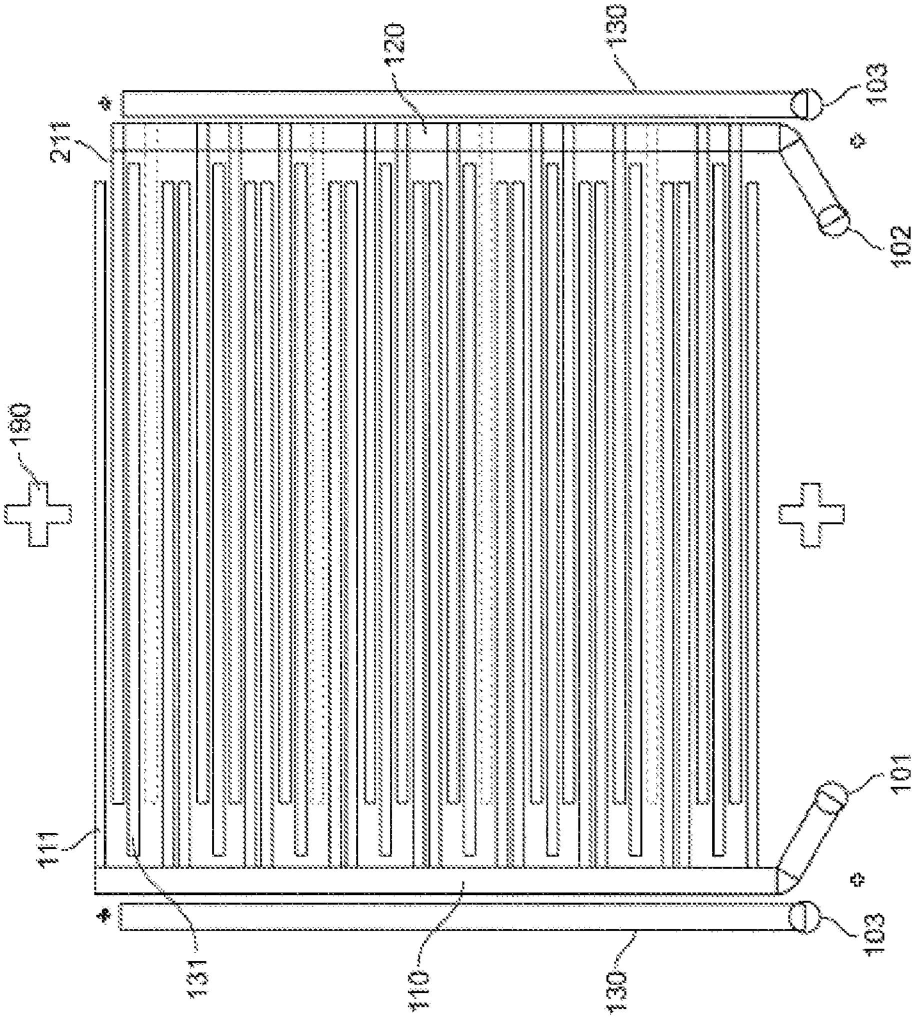
FIG. 11A is a schematic representation of a layer containing channels and arterial lines for a microfluidic device.
Figure 11B:
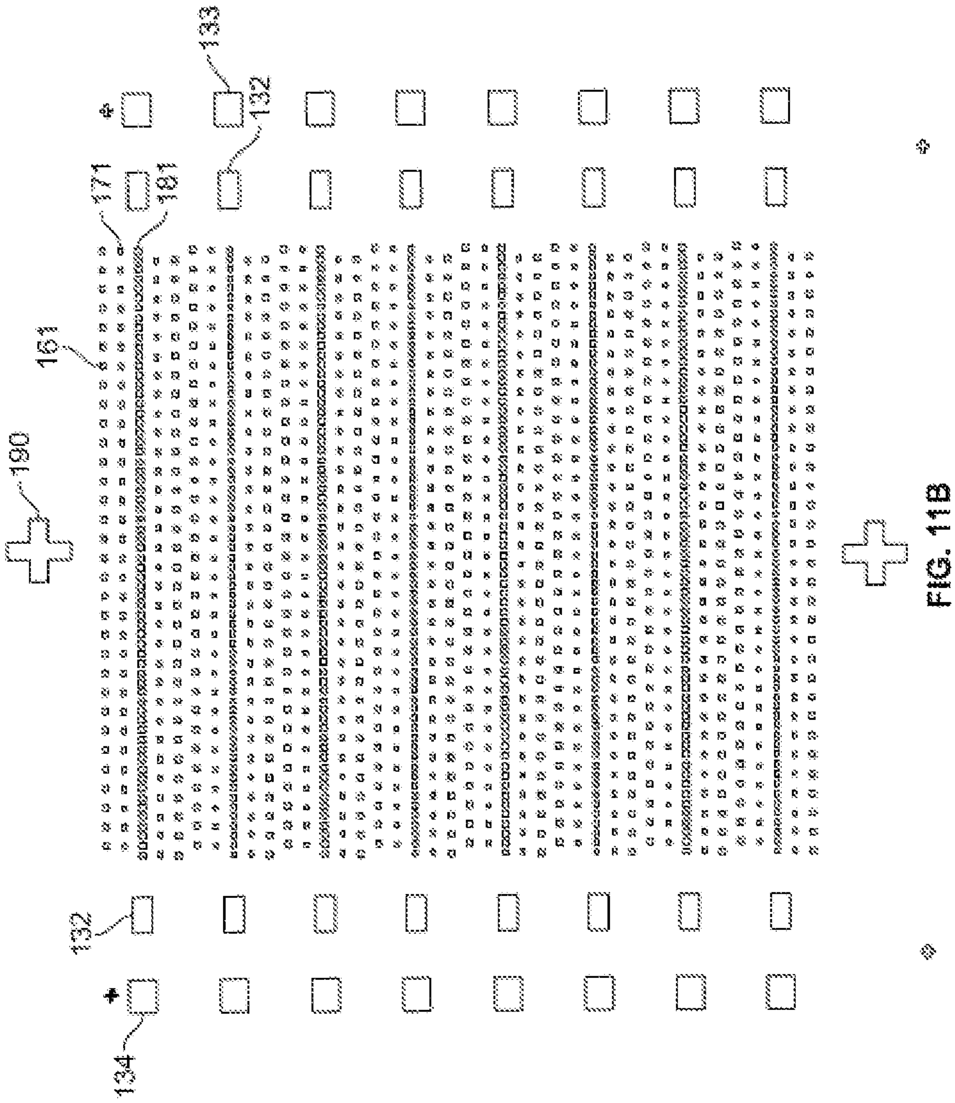
FIG. 11B is a schematic representation of a layer containing through-holes and underpasses for a microfluidic device.
Figure 11C:
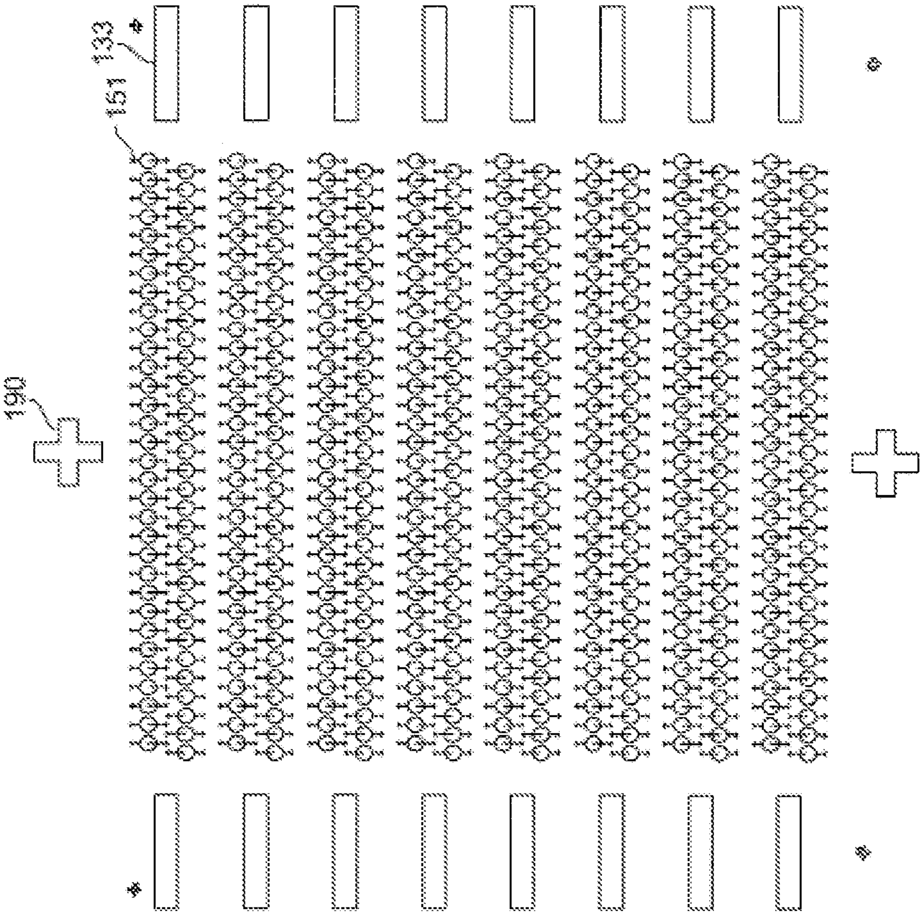
FIG. 11C is a schematic representation of a layer containing droplet makers for a microfluidic device.

A schematic of each layer of the microfluidic device is shown in FIGS. 11A-11C. In FIG. 11A, first layer comprises continuous phase arterial line 110, fed by inlet 101, which supplies continuous phase channels 111. Disperse phase arterial line 120, fed by inlet 102, supplies disperse phase channels 121. Outlet channels 131 feed into outlet arterial lines 130, which exit at outlets 103. Alignment guide 190 is used to align the three layers. The second layer, shown in FIG. 11B, comprises through-holes 161, 171, 181 that connect the droplet makers 151 (FIG. 11C) to the channels on the first layer. The second layer also comprises through-holes 132, 133 that connect the underpass 133 (shown in FIG. 11C) to the outlet channels 131 and outlet arterial line 130.

The two dimensional array of droplet makers was tested using two syringe pumps, one for the oil and one for the aqueous input. The aqueous phase input was set to $\Phi$=8 ml/hr and the oil phase was set to $\Phi$=20 ml/hr. The flow rates were not limited by the device, but by the syringe pumps. It was hypothesized that higher throughputs would be possible by switching to peristaltic pumps. Droplet formation was observed on all five hundred and twelve droplet makers using an upright microscope (Nikon SMZ-1B). A histogram (FIG. 10) was generated for the total output of the 512 droplet makers. The droplets had an average diameter of d=86.1 μm and CV=9.0%. It was hypothesized that the variations in drop size from drop-maker to drop-maker increased relative to the 8 droplet device due mainly to the increased area of the chip which exacerbated small variations in alignment. Alignment could be better improved by switching to a material more rigid than PDMS.

The examples demonstrated the ability to integrate many droplet makers onto a single chip. The hybrid laser micromachined/soft lithography defined device helped to maximize the density of droplet makers, while maintaining a high degree of homogeneity. 1. Thick, laser micromachined channels delivered flow to many droplet makers with minimum pressure drop. 2. Fine featured soft-lithography defined droplet makers, for small droplets with precisely defined features. 3. Only two inputs and one output for a very large number of droplet makers, for ease of use and integration. 4. Inexpensively manufactured, all PDMS device.

The device architecture and methods can be used to fabricate a chip well beyond the 512 in the example above. One of the main limitations to increasing the number of droplet makers is the design condition outlined in Eq. 1. Due to this constraint, increases in the number of droplet makers N can be accompanied by a decrease in the flow resistance of the supply lines or an increases in the flow resistance of the droplet makers. For instance, the isotropic scaling of the droplet makers from having an aperture size of 30 μm to 2 μm would increase the flow resistance of the droplet maker ($R_d$=12 μl/wh$^3$) by a factor of ~$10^3$ allowing approximately 1000× more droplet makers N to be included for a given supply channel. The infrared laser micromachining used in the example above, which has a resolution of ~100 μm. UV laser micromachining could be utilized, which can achieve ~1 μm feature size. With such a device, a 3×3 $cm^2$ chip containing $2\times10^6$ droplet makers could be fabricated (1000× 2000), with a throughput of >$15\times10^9$ droplets/min.

What is claimed:

1. A microfluidic device comprising:

a first layer comprising at least one flow channel for a continuous phase, at least one flow channel for a disperse phase, and at least one outlet channel;

a second layer comprising a plurality of droplet makers, the plurality of droplet makers comprising a row of droplet makers; and a third layer comprising through-holes connecting the channels of the first layer with the plurality of droplet makers on the second layer;

wherein the plurality of droplet makers are in fluidic communication with the at least one flow channel for the continuous phase, the at least one flow channel for the disperse phase, and the at least one outlet channel, wherein the channels on the first layer have a height at least 4 times greater than the height of the droplet makers, and wherein the microfluidic device further satisfies the equation, 2N(Rr/Rd)<0.5, wherein N is the number of droplet makers in the row of droplet makers, Rr is a fluidic resistance along a flow channel for the continuous phase or a flow channel for the disperse phase extending between each droplet maker of the row, and Rd is a fluidic resistance of a droplet maker of the row.

2. The microfluidic device of claim 1, wherein the channels of the first layer are formed by direct laser micromachining and the droplet makers are formed by soft-lithography.

3. The microfluidic device of claim 1, wherein the second layer comprises at least 500 droplet makers in an area less than 10 $cm^2$.

4. The microfluidic device of claim 1, wherein the second layer comprises at least 1000 droplet makers in an area less than 10 $cm^2$.

5. The microfluidic device of claim 1, wherein the second layer comprises at least 100,000 droplet makers in an area less than 10 $cm^2$.

6. The microfluidic device of claim 1, wherein the second layer comprises at least 1,000,000 droplet makers in an area less than 10 $cm^2$.

7. The microfluidic device of claim 1, wherein the first, second, and third layers are comprised of a material selected from a group consisting of poly(dimethyl siloxane), silicon, glass, plastic, metal, and ceramic.

8. The microfluidic device of claim 7, wherein the first, second, and third layers are comprised of a material selected from a group consisting of poly(dimethyl siloxane), silicon, and glass.

9. The microfluidic device of claim 1, wherein the plurality of droplet makers comprise droplet makers selected from a group consisting of flow-focusing droplet makers, T-junction droplet makers, Janus droplet makers, and multiple emulsion droplet makers.

10. The microfluidic device of claim 1, wherein the device comprises a single flow channel for the continuous phase, a single channel for the disperse phase, and a single channel for the outlet.

11. A method of fabricating a microfluidic device comprising:

forming a plurality of channels in a first layer, wherein the plurality of channels comprises at least one continuous phase channel, at least one disperse phase channel, and at least one outlet channel;

forming a plurality of droplet makers in a second layer, wherein the plurality of droplet makers comprises a row of droplet makers and wherein each of the plurality of channels has a height at least 4 times greater than the height of each of the plurality of droplet makers; and bonding the first layer and the second layer to a third layer, wherein the third layer comprises a plurality of through-holes fluidically connecting the plurality of channels in the first layer to the plurality of droplet makers in the second layer, and the method being performed such that the microfluidic device satisfies the equation, 2N(Rr/Rd)<0.5, wherein N is the number of droplet makers in the row of droplet makers, Rr is a fluidic resistance along a continuous phase flow channel or a disperse phase flow channel extending between each droplet maker of the row, and Rd is a fluidic resistance of a droplet maker.

12. The method of claim 11, wherein forming a plurality of channels in the first layer comprises direct laser micromachining the plurality of channels.

13. The method of claim 11, wherein forming the plurality of droplet makers in the second layer comprises soft-lithography molding the droplet makers.

14. The method of claim 11, further comprising forming the plurality of through-holes in the third layer by direct laser micromachining.

15. The method of claim 11, wherein bonding the first layer and the second layer to a third layer comprises applying a layer of poly(dimethyl siloxane) to the third layer and curing the layer of poly(dimethyl siloxane) to bond the layers.

16. The method of claim 11, wherein the first, second, and third layers are comprised of a material selected from a group consisting of poly(dimethyl siloxane), silicon, glass, plastic, metal, and ceramic.

17. The method of claim 11, wherein the second layer comprises at least 500 droplet makers in an area less than 10 $cm^2$.

18. The method of claim 11, wherein the second layer comprises at least 1000 droplet makers in an area less than 10 $cm^2$.

19. The method of claim 11, wherein the second layer comprises at least 100,000 droplet makers in an area less than 10 $cm^2$.

20. The method of claim 11, wherein the second layer comprises at least 1,000,000 droplet makers in an area less than 10 $cm^2$.

* * * * *